United States Patent [19]
McKay et al.

[11] Patent Number: 6,051,856
[45] Date of Patent: Apr. 18, 2000

[54] VOLTAGE-CONTROLLED RESISTOR UTILIZING BOOTSTRAP GATE FET

[75] Inventors: Thomas G. McKay, Felton; Joseph Barrera, Los Altos Hills, both of Calif.

[73] Assignee: Samsung Electronics Co., Ltd., Seoul, Rep. of Korea

[21] Appl. No.: 08/940,339

[22] Filed: Sep. 30, 1997

[51] Int. Cl.[7] .................................................. H01C 29/76
[52] U.S. Cl. .................... 257/289; 257/279; 257/360; 257/364
[58] Field of Search .............................. 257/24, 219, 289, 257/360, 365, 200, 279, 412, 364, 272

[56] References Cited

U.S. PATENT DOCUMENTS

| | | | |
|---|---|---|---|
| 4,143,387 | 3/1979 | Stikvoort | 357/23 |
| 4,157,557 | 6/1979 | Sato et al. | 357/23 |
| 4,442,445 | 4/1984 | Malik et al. | 357/22 |
| 4,843,033 | 6/1989 | Plumton et al. | 257/279 |
| 4,895,811 | 1/1990 | Inoue | 257/279 |
| 5,011,785 | 4/1991 | Nguyen | 257/279 |
| 5,214,298 | 5/1993 | Yuan et al. | 257/194 |

OTHER PUBLICATIONS

"The Bootstrapped Gate FET (BGFET)—A New Control Transistor," Bayruns et al., GaAs IC Symposium, 0–7803–2966–X/95.

*Primary Examiner*—Donald L. Monin, Jr.
*Assistant Examiner*—Michael Dietrich
*Attorney, Agent, or Firm*—Townsend and Townsend and Crew LLP

[57] ABSTRACT

An improved FET for use as a voltage-controlled resistor includes a p-type control gate and a high-resistance connection to receive a control signal. The bootstrap frequency for the device is much lower than the signal frequency so that the signal frequency is decoupled from the control voltage to reduce distortion.

1 Claim, 4 Drawing Sheets

VOLTAGE-CONTROLLED RESISTOR UTILIZING BOOTSTRAP GATE FET

BACKGROUND OF THE INVENTION

Many microwave circuits require a voltage-controlled resistor for controlling the amplitude of a received signal. For example, the amplitude of a signal received by a cellular phone depends on the distance from the transmitter. Strong signals need to be attenuated for further processing. Typically, the control signal frequencies are orders of magnitude smaller than signal frequencies. In the cellular phone example, the control voltage needs to respond to changes in signal strength due to movement of a car and thus need only have a response time on the order of milliseconds, while a typical radio-frequency (RF) signal changes amplitude in microseconds for frequencies in the megahertz range and nanoseconds for frequencies in the gigahertz range.

Integrated circuits require a voltage-controlled resistor implemented as a solid state device. One effective device is a P-I-N diode. However, this device requires a high operating current is not ideally suited for hand held consumer devices utilizing small power supplies.

Another device utilized as a voltage-controlled resistor is a metal-semiconductor field-effect transistor (MESFET). FIG. 1 is a diagram of a MESFET connected as a voltage-controlled resistor. Referring to FIG. 1, the MESFET 10 includes source and drain terminals 12 and 14, a channel 16, and metal gate 18. The source and drain metal contacts are ohmically coupled to the source and drain terminals. The metal gate forms a Shottky contact with the channel.

When operating as a voltage-controlled resistor the source and drain terminals function as the RF terminals of the resistor. The gate terminal is connected to control voltage which creates a depletion region 20 under the gate having a depth controlled by the magnitude of the control voltage. As the gate voltage is negatively increased the depletion region moves deeper into the channel thereby reducing the cross-sectional area through which current can flow and increasing the channel resistance.

As is well-known a capacitance is associated with depletion area formed under the gate. A high frequency signal, coupled to the source/drain terminals of the MESFET splits into two components, a main component passing through the channel and the an unwanted component going through the depletion capacitance, the low resistance metal gate, and back into the channel. The unwanted signal component that passes through the depletion capacitance modulates the channel resistance at the signal frequency, resulting in distortion.

A publication entitled *The Bootstrapped Gate FET (BGFET)—A New Control Transistor*, by Bayruns et al. GaAS IC Symposium, 0-7803-2966-X/95 describes a solution to the problem. A p-type gate is implanted below the channel.

Accordingly, research continues to develop an efficient voltage-controlled resistor in the form of a semiconductor device that can be utilized with integrated circuits.

SUMMARY OF THE INVENTION

According to one aspect of the present invention, a voltage-controlled resistor includes an FET having a high resistance p-type gate.

The high resistivity gate decouples the controlling electrode of a variable conductance channel from the source and drain radio-frequency (RF) signal terminal characteristics. Decoupling the control signal and the RF signal in this way removes a major source of signal distortion common in FETs used as voltage-controlled resistors.

According to another aspect of the invention, the doping concentrations of the channel and gate are controlled so that the gate is substantially depleted during operation.

According to another aspect of the invention, the p-type gate, n-type channel, n-type source, and n-type drains are formed by ion-implantation of a gallium arsenide (GaAs) substrate.

According to another aspect of the invention, the control gate is coupled to the control signal through an ion-implanted p-type resistor.

Other features and advantages will be apparent in view of the following detailed description and appended drawings.

DETAILED DESCRIPTION OF THE PREFERRED EMBODIMENTS

Figure 1:
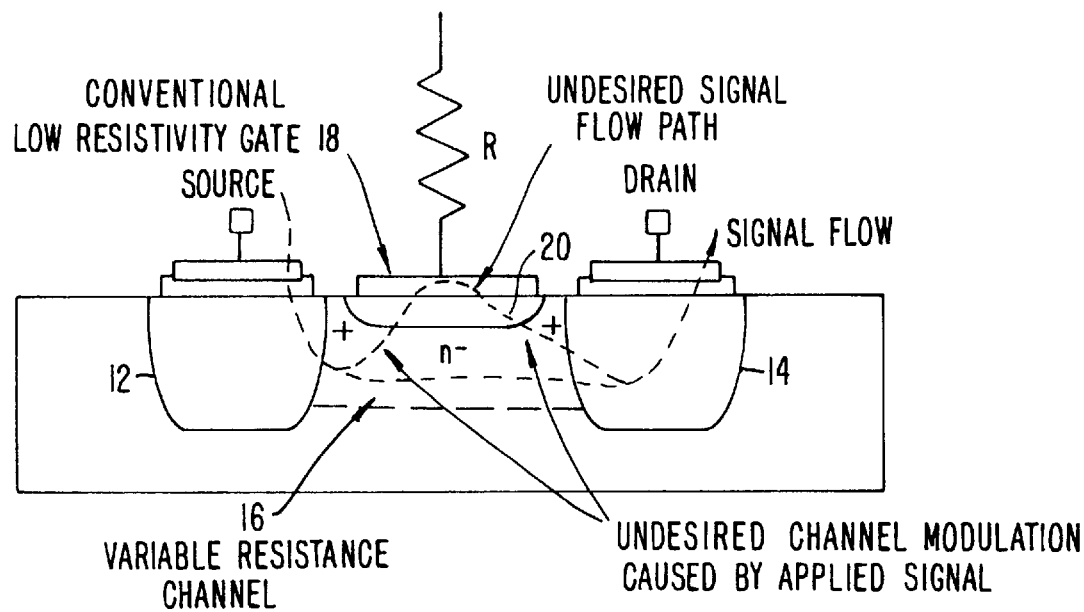
FIG. 1 is a cross-sectional schematic diagram of a prior art MESFET voltage-controlled resistor.
Figure 2:
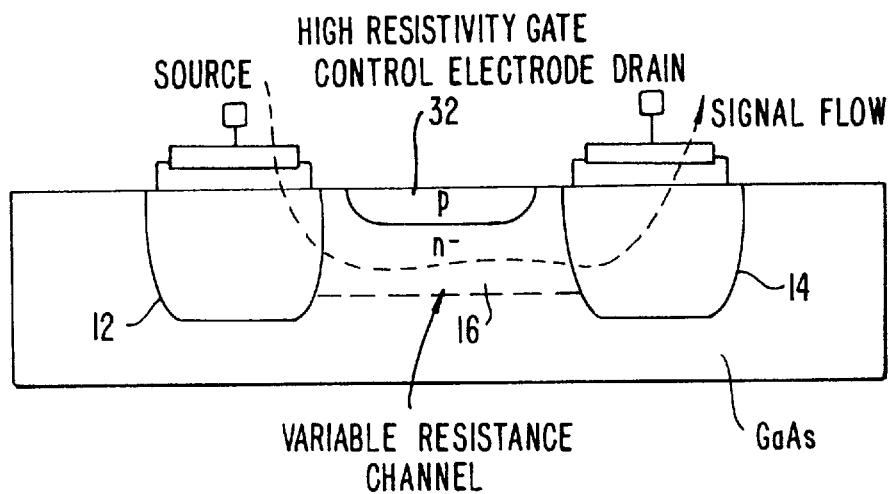
FIG. 2 is a cross-sectional schematic diagram of a preferred embodiment of the invention.

With reference to the drawings, like or similar parts will be given the same reference throughout the several views. FIG. 2 depicts an FET transistor 30 including source and drain electrodes 12 and 14, a variable resistance N- doped channel 16, a P doped high resistance gate control electrode 32 formed by ion implantation of a GaAs substrate.

A negative control voltage is coupled to the gate electrode as is described more fully below. In operation, the terminals are connected to conduct an RF signal voltage and the control gate is coupled to a negative going control voltage. Due to the formation of the depletion region between the junction formed between the P doped control gate and the N-doped channel, the gate electrode is highly depleted. This depletion of the gate electrode 32 and the fact that the mobility of holes is very low causes the control gate to be of high resistance.

The operation of the device depicted in FIG. 2 will now be described. The channel resistance is modulated by applying reverse bias to the p-type gate 32. As the reverse bias on the p-n junction between the p-type gate and n-type channel increases, the region of the n-type channel that is fully depleted of mobile carriers (electrons) increases. The region of the n-type channel that is undepleted decreases, increasing the resistance from source to drain.

The role of the control signal is to control the resistance of the channel. The signal electrodes are used to apply and extract an RF signal which will be attenuated to varying degree depending on the value of the control signal.

The gate p-type electrode 32 is coupled to the channel via a depletion region capacitance (not shown). The bootstrap time constant is determined by the depletion region capacitance and the resistance of the control gate and is given by the formula:

$$t_{bootstrap} = R_{gate} * C_{gate}.$$

For RF signal frequencies well above the bootstrap frequency, where the bootstrap frequency is defined by the formula:

$f_{signal} >> 1/t_{bootstrap}.$ the RF signal is decoupled from the control signal because the RF signal cannot change the voltage across the depletion region anywhere along the channel.

As described above, typically changes in the control signal take place in milliseconds while changes in the RF signal voltage take place in microseconds or nanoseconds. The high resistance of the control gate results in a time constant that is short compared to modulations in the control voltage so that the control gate is responsive to control signals. However, the resulting time constant is long compared to changes in the signal voltage so that the control gate is not responsive to signal voltage changes.

As noted above, the connection to the p-type control gate must be of high resistance to maintain a low bootstrap frequency. A configuration of a control gate and interconnection is depicted in FIGS. 3A and B. where FIG. 3B is an expanded view of the region marked Detail "A" in FIG. 3A.

Figure 3A:
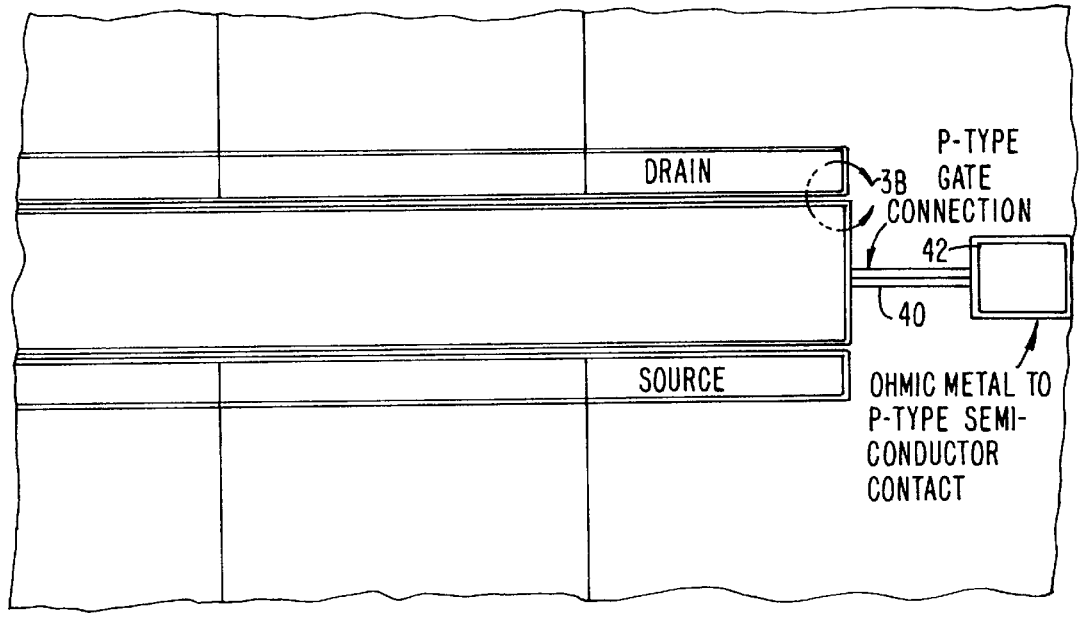
FIGS. 3A and 3B are top views of preferred embodiment of the invention.
Figure 3B:
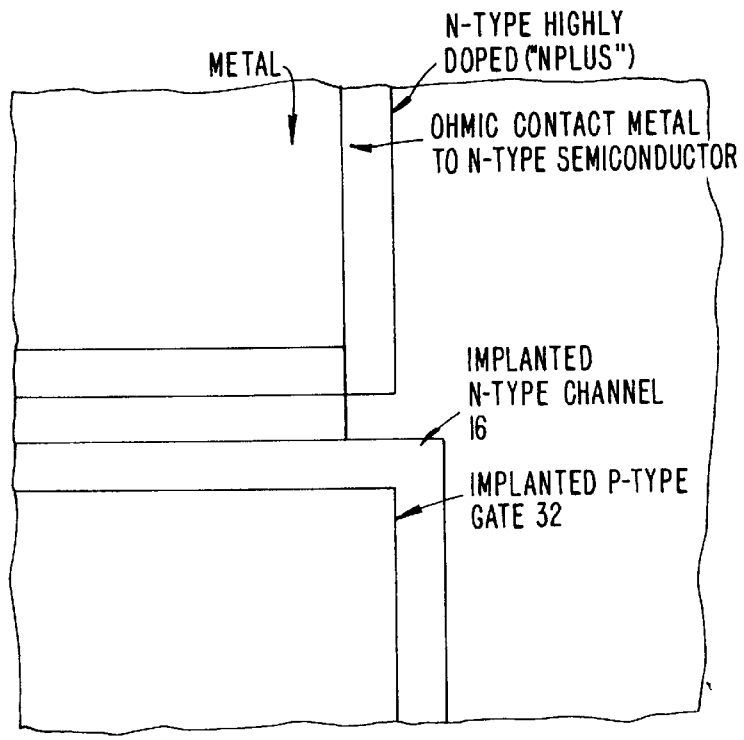

Turning now FIGS. 3A and 3B, note that the control gate 32 is implanted within the channel. Also, a resistive p-type connector resistor 40 and a remote contact area 42 are also implanted. Utilizing the p-type resistor 40 and remote contact 42 area increases the resistance of the p-type control gate. In practice, several resistors and contact areas could be implanted to increase responsiveness of the control gate to the control voltage signal.

Figure 4:
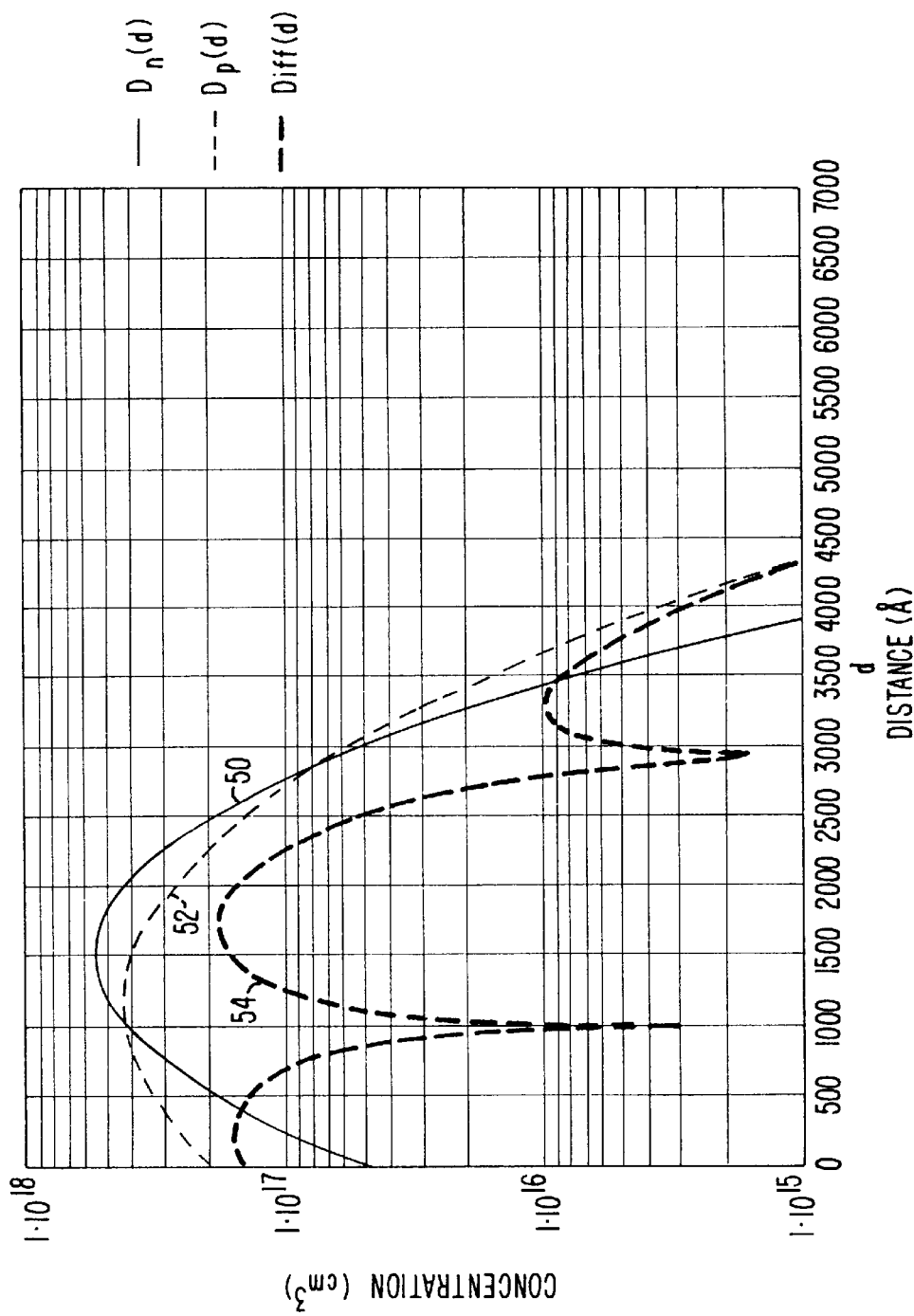
FIG. 4 is a graph of concentration vs. distance.

FIG. 4 is a graph depicting p-n junction implant concentrations for forming the p-n junction between the p-type control gate and n-type channel. As depicted on the graph, dopant concentration (in cm$^{-3}$) is measured along the vertical Aaxis and distance (in angstroms) is measured along the horizontal axis. The solid line 50 represents n-type dopant concentration, the line with small dashes 52 is p-type dopant concentration, and the line with large dashes 54 is the differential concentration. For this example, the p-type control gate extends about 1,000 angstroms into the surface.

Figure 5:
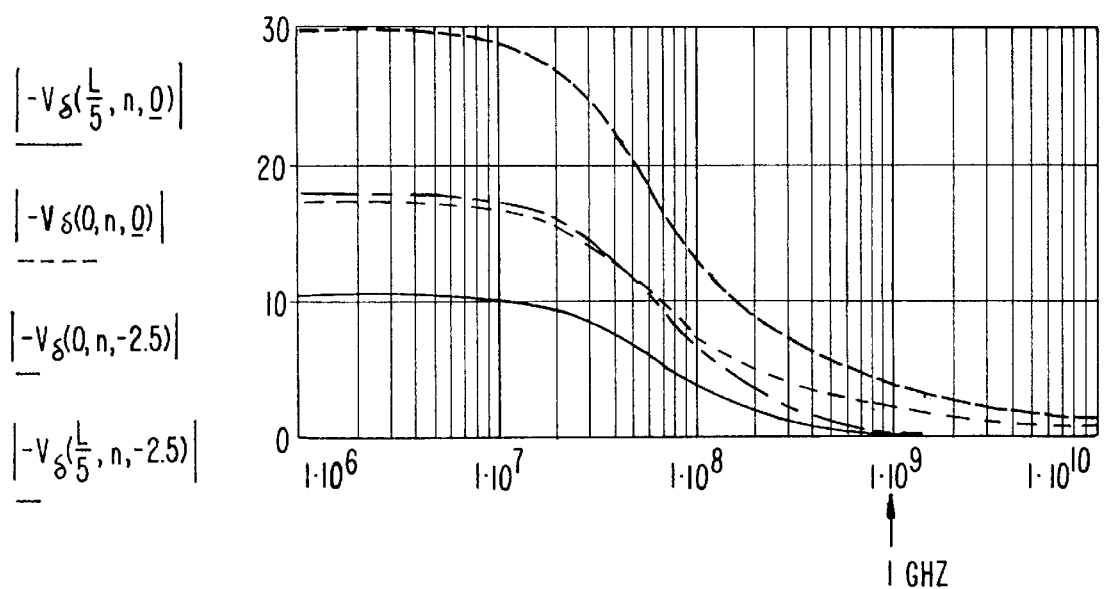
FIG. 5 is a graph of voltage coupling vs. frequency.

FIG. 5 depicts the signal voltage/control voltage coupling at various locations on the gate for the doping levels depicted in FIG. 4, where frequency is plotted along the horizontal axis. The voltage coupling essentially goes to zero at about 1 Gigahertz.

The invention has now been described with reference to the preferred embodiments. Alternatives and substitutions will now be apparent to persons of skill in the art. In particular, an embodiment fabricated in GaAs substrate has been described. However, similar concepts can be implements in a device fabricated in a silicon substrate. Different doping levels and geometries may be better suited for different applications requiring control signal modulation at different frequencies or for use with signals of different frequencies. Accordingly, it is not intended to limit the invention except as provided by the appended claims.

What is claimed is:

1. An improved field-effect transistor (FET) formed on a major surface of a GaAs semiconductor substrate, with the FET having n-type lightly doped source and drain contact and a lightly doped n-type ion-implanted variable resistance channel formed in a channel region of the major surface located between the source and drain contacts, said FET comprising:

a high resistance p-type ion-implanted control gate formed within said channel region along said major surface;

a high resistance connection, comprising a p-type implanted contact region located on said major surface remote from said p-type control gate and a p-type implanted resistor coupling said control gate to said contact region, for coupling a control voltage to said p-type control gate.

* * * * *